(12) United States Patent
Barnett et al.

(10) Patent No.: US 9,280,784 B2
(45) Date of Patent: Mar. 8, 2016

(54) METHOD FOR MEASURING ENGAGEMENT

(71) Applicants: Samuel Benjamin Barnett, Northbrook, IL (US); Moran Cerf, Northbrook, IL (US)

(72) Inventors: Samuel Benjamin Barnett, Northbrook, IL (US); Moran Cerf, Northbrook, IL (US)

(73) Assignee: SBB Research Group LLC, Northbrook, IL (US)

( * ) Notice: Subject to any disclaimer, the term of this patent is extended or adjusted under 35 U.S.C. 154(b) by 0 days.

(21) Appl. No.: 14/604,338

(22) Filed: Jan. 23, 2015

(65) Prior Publication Data

US 2015/0206174 A1 Jul. 23, 2015

Related U.S. Application Data

(60) Provisional application No. 61/930,574, filed on Jan. 23, 2014.

(51) Int. Cl.
*G01V 3/00* (2006.01)
*G06Q 30/02* (2012.01)
*G01R 33/48* (2006.01)

(52) U.S. Cl.
CPC ........ *G06Q 30/0242* (2013.01); *G01R 33/4806* (2013.01)

(58) Field of Classification Search
CPC .................................................. G01R 33/4806
USPC .............. 324/300, 306, 307, 309; 705/14.41, 705/14.52
See application file for complete search history.

(56) References Cited

U.S. PATENT DOCUMENTS

| | | | | |
|---|---|---|---|---|
| 6,477,399 | B2 * | 11/2002 | Biswal et al. | 600/410 |
| 8,494,905 | B2 * | 7/2013 | Pradeep et al. | 705/14.42 |
| 8,635,105 | B2 * | 1/2014 | Pradeep et al. | 705/14.42 |
| 2008/0091512 | A1 | 4/2008 | Marci et al. | |
| 2009/0285456 | A1 | 11/2009 | Moon et al. | |
| 2010/0094702 | A1 * | 4/2010 | Silberstein | 705/14.43 |
| 2011/0119129 | A1 | 5/2011 | Pradeep et al. | |
| 2011/0161011 | A1 | 6/2011 | Hasson et al. | |

* cited by examiner

*Primary Examiner* — Louis Arana
(74) *Attorney, Agent, or Firm* — Jeffrey Schox; Thomas Gwinn

(57) ABSTRACT

A method for measuring engagement includes presenting a set of stimuli to a set of subjects, capturing neural data from the subjects, calculating a set of neural similarities between the first set of subjects, and generating a measure of engagement from the set of neural similarities.

14 Claims, 4 Drawing Sheets

```
Presenting Stimuli S110
        │
Capturing Neural Data S120
        │
Capturing Addt'l Data S125
        │
Calculating Neural Similarity S130
        │
Generating Measure of
    Engagement S140
        │
Predicting Measure of
    Engagement S145
```

METHOD FOR MEASURING ENGAGEMENT

CROSS-REFERENCE TO RELATED APPLICATIONS

This application claims the benefit of U.S. Provisional Application Ser. No. 61/930,574, filed on 23 Jan. 2014, which is incorporated in its entirety by this reference.

TECHNICAL FIELD

This invention relates generally to the neuromarketing field, and more specifically to new and useful methods for measuring engagement in the neuromarketing field.

BACKGROUND

Measuring consumer engagement is crucial to making and evaluating marketing decisions, especially as regards content creation. Traditional methods of measuring consumer engagement (such as recording subjective ratings or measuring exposure time) suffer both from accuracy issues and lack of temporal granularity. Newer methods of measuring engagement using neurological data have been proposed, but these methods often suffer from the same issues. Thus, there is a need in the neuromarketing field to create a method for measuring consumer engagement that is both accurate and granular. This invention provides such a new and useful method.

DESCRIPTION OF THE PREFERRED EMBODIMENTS

The following description of the preferred embodiments of the invention is not intended to limit the invention to these preferred embodiments, but rather to enable any person skilled in the art to make and use this invention.

Figure 1:
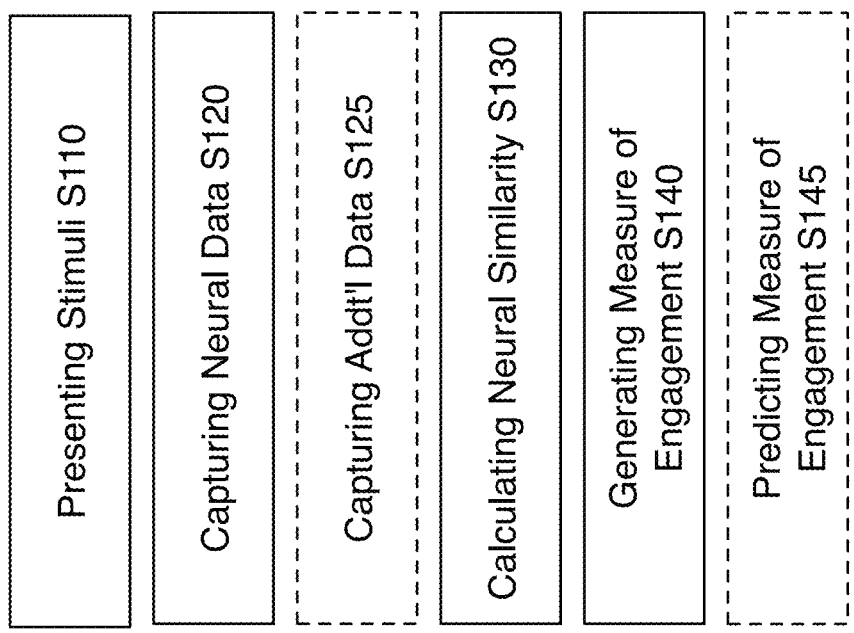
FIG. 1 is a chart view of a method of a preferred embodiment.

As shown in FIG. 1, a method 100 for measuring engagement includes presenting stimuli S110; capturing neural data S120; calculating neural similarity S130; and generating a measure of engagement S140. The method 100 may additionally or alternatively include capturing additional data S125 and/or predicting a measure of engagement S145.

The method 100 preferably functions to measure engagement based on neural data collected from people during the presentation of stimuli. The method preferably bases the measure of engagement on neural data collected throughout the presentation of stimuli, so that engagement can be seen over time. For example, if a movie was presented to a group of people, the measure of engagement could show the level of engagement the group (or a subset of the group) displayed in response to different scenes in the movie; the measure of engagement could also show how engaging the movie was overall. The method 100 preferably performs cross-brain correlations of neural data, calculated across pairs (a measure of neural similarity), as input for the measure of engagement.

The method 100 additionally may function to provide a measure of engagement across small and precise time ranges. Understanding that one characteristic of engaging content is its ability to generate similar neural responses in different individuals, this preferably enables the method 100 to operate without the need to specify a model for the neural processes of engagement. The method 100 may additionally or alternatively be used to identify neural outliers (e.g., individuals whose brains do not exhibit typical neural behavior); for example, the method 100 might be used to help diagnose autism spectrum disorders or other neural disorders. The method 100 may additionally or alternatively be used to predict engagement based on previously acquired neural data; for example, the method 100 may predict the engagement of a twenty-three year old Asian female based on previously acquired measures of engagement for persons of similar demographics. As another example, the method 100 may predict the engagement of an individual based on biometric data, where the measured biometric data is compared to previously measured biometric data linked to measures of engagement.

Presenting stimuli S110 functions to present stimuli for which a measure of engagement will be generated. Stimuli preferably comprise audiovisual stimuli; for example, a film or TV clip. Stimuli may additionally or alternatively comprise any stimuli for which engagement is to be measured; for example, a song, an audiobook, or a silent film clip. Stimuli may deal with any sensory modalities (e.g., taste, touch, smell, direct brain stimulation).

Presenting stimuli S110 preferably includes presenting stimuli such that each part of the stimuli is presented to all subjects at the same rate. The presentation of stimuli may occur to multiple subjects at the same time. Alternatively, the presentation of stimuli can occur to multiple subjects, wherein at least two subjects are presented the stimuli asynchronously (i.e., at different times). The progression of the stimuli is preferably monitored, tracked, and mapped to the captured neural data described above. Presenting stimuli at the same rate is natural for a movie (unless the movie is sped up or slowed down, the parts of the stimuli are presented at the same rate), but is not for a book (since people read at different speeds). The continuous and synchronized presentation of stimuli, as in the movie, can be referred to as presenting continuous stimuli.

If particular stimuli as typically presented would result in parts of the stimuli being presented at different rates to different subjects, this is preferably corrected for. For example, if the stimuli comprise a book, sections of the book may be presented on a screen serially, with engagement measured for each chunk. Such batched, staged, or forced synchronization of the presented stimuli can be referred to as presenting a set of discrete stimuli. As another example of presenting a set of discrete stimuli, readers of the book may have their page-turns tracked, so that there is a correlation between time and page (which can later be used to determine engagement for each page).

Presenting stimuli S110 preferably includes presenting the same stimuli to all subjects in the same environment, but alternatively may include presenting different stimuli to groups of subjects and/or presenting stimuli to subjects in different environments. For example, Step S110 may include presenting a movie to a groups of subjects placed in rooms of different temperatures in order to judge the effects of temperature on engagement for that particular movie. This process could be repeated for other stimuli to provide broader insights into the effects of temperature on engagement.

Figure 2:
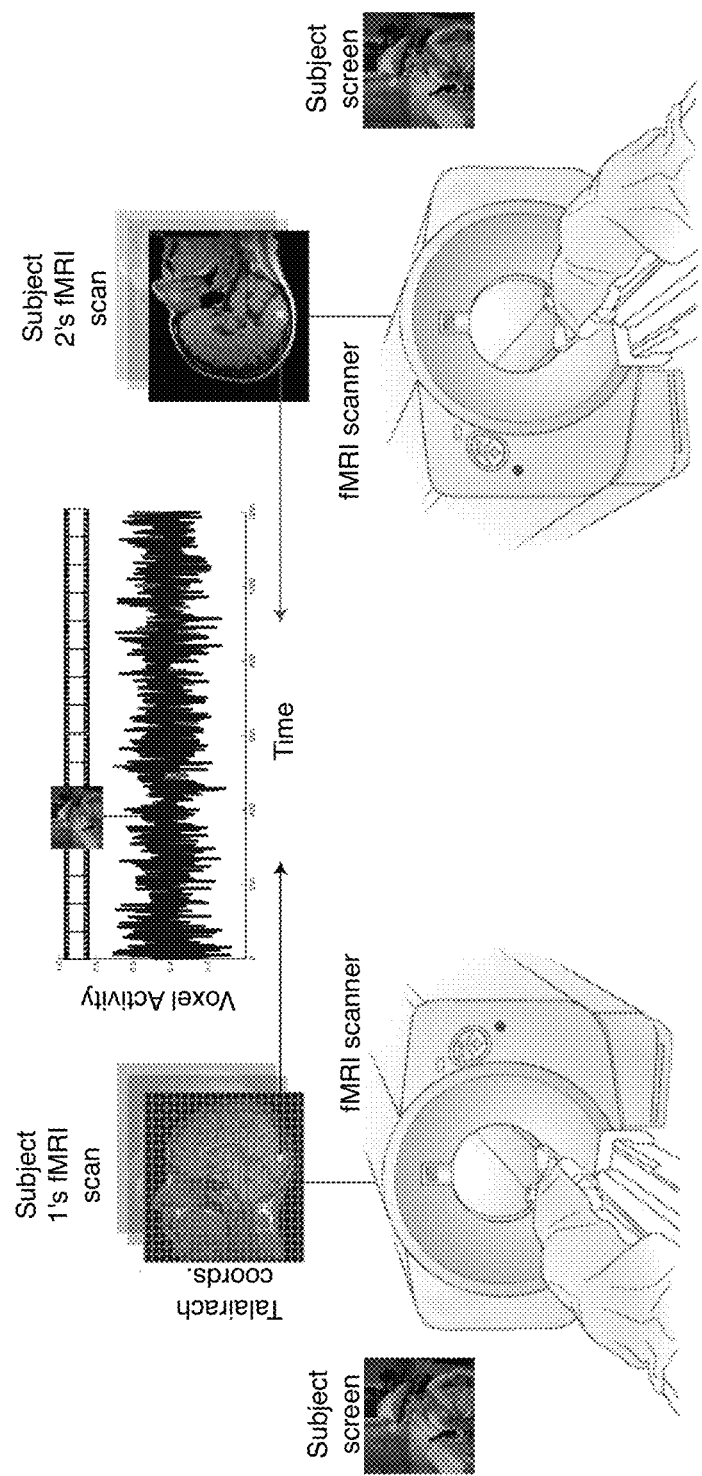
FIG. 2 is diagram view of capturing neural data of a method of a preferred embodiment.

As shown in FIG. 2, capturing neural data S120 functions to capture neural data from subjects during the presentation of stimuli. Capturing neural data preferably includes capturing neural data throughout the duration of the presented stimuli, but alternatively may include capturing neural data only at specific points during the presentation of stimuli.

The captured neural data is preferably synchronized to the presentation of stimuli, which functions to capture neural data that is substantially synchronized to the stimuli responses of multiple subjects. Captured neural data is preferably synchronized to stimuli by matching timestamps, but may additionally or alternatively be synchronized in any suitable way. For example, if flashing a red background for a brief period of time (perhaps a period of time short enough to be unnoticeable to the conscious brain) triggers a reliable response in the human brain (i.e., it can be detected reliably in contrast to other neural responses), the flashing light can be used as a synchronizing signal. As another example, subjects may be asked to perform an action (e.g., clapping); this action produces measurable neural affects that can be used to perform synchronization.

Capturing neural data S120 preferably includes capturing functional neural data. Capturing functional neural data preferably include capturing functional Magnetic Resonance Imaging (fMRI) data, but may additionally or alternatively include electroencephalography (EEG) data, electrocorticography (ECoG) data, functional near-infrared spectroscopy (fNIRS) data, Magnetoencephalography (MEG), and/or any other suitable neural data. Capturing fMRI data preferably includes capturing blood-oxygen-level dependent (BOLD) contrast signals, but may additionally or alternatively include capturing temperature contrast signals, pH contrast signals, calcium-sensitive agent contrast signals, neuronal magnetic field contrast signals, Lorentz-effect signals, and/or any other suitable type of signals. fMRI data is preferably captured over a three-dimensional volume by scanning a series of two-dimensional slices. Capturing neural data may additionally include capturing anatomical neural data. Capturing anatomical neural data preferably includes capturing anatomical neural data using a magnetization-prepared rapid-acquisition gradient echo (MPRAGE) pulse sequence, but alternatively may include capturing anatomical neural data by any other suitable method.

In a variation of a preferred embodiment, Step S120 includes capturing neural data via electroencephalography (EEG). In this variation, Step S120 preferably includes placing electrodes on the scalps of subjects and measuring electrical activity in brain as recorded by the electrodes. Step S120 preferably includes collecting EEG data via a low density electrode array (e.g., thirty-two or fewer electrodes), but may additionally or alternatively include collecting EEG data using electrode arrays of any density. Electrode arrays may be spatially fixed (e.g., electrodes are attached to a cap worn by a subject; the distance between electrodes is fixed), but may alternatively be free (e.g., electrodes are placed manually on a person's scalp and can be positioned in any pattern). EEG data may be represented using any montage (e.g., sequential montage, referential montage, average reference montage, laplacian montage). In this variation, Step S120 preferably includes capturing data from electrodes individually, but may additionally or alternatively include averaging data from several electrodes. For example, the data from three electrodes may be averaged together.

In a second variation of a preferred embodiment, Step S120 includes capturing EEG data and FRMI data simultaneously (e.g., by using an FMRI compatible EEG array). Step S120 may include any combination of multiple types of capturing neural data.

Capturing neural data S120 preferably also includes processing the raw data. Processing the raw data preferably includes transforming raw data to prepare it for visualization or later calculations. Processing the raw data preferably also includes aligning the data to reference markers and filtering the data to remove noise and artifacts.

fMRI data is preferably 3D motion corrected and slice scan time corrected, followed by a linear trend removal and high pass filtering. Spatial smoothing is preferably then applied to the fMRI data. The fMRI data is preferably transformed to 3D Talairach spaces and projected upon reconstructions of cortical surfaces generated from captured anatomical neural data. The fMRI data may alternatively be processed in any other way (or not processed at all). For example, the fMRI data may be transformed and/or reregistered according to the MNI atlas from the Montreal Neurological Institute instead of according to the Talairach atlas. BOLD contrast signals are preferably processed as well; the mean white matter signal is preferably projected out from the BOLD signal in each voxel of fMRI data in each subject. For each subject, the mean BOLD signal is preferably calculated and entered into a linear regression to predict the BOLD signal in each voxel; the BOLD signals are preferably then replaced with the residuals resulting from this regression.

EEG data is preferably filtered (e.g., by high-pass filtering at 1 Hz and low-pass filtering at 70 Hz) to remove high and low frequency artifacts. EEG data may additionally or alternatively be filtered or processed in any suitable manner (e.g., passed through a 60 Hz notch filter to remove powerline noise). For example, EEG data may be processed to remove eye-induced artifacts (e.g., eye blinks), cardiac artifacts, and/or muscle activation artifacts. Independent component analysis techniques may be used to process EEG data.

If fMRI and EEG data is captured simultaneously, the data may be processed to remove artifacts introduced by using both neural data capture methods simultaneously (e.g., MRI gradient artifacts may be removed from fMRI data, while ballistocardiographic artifacts may be removed from EEG data). EEG and fMRI data may also be temporally re-synchronized (since data derived from fMRI often occurs over a different time course than data derived from EEG).

Processing the raw data may additionally or alternatively include processing data based on additional data captured by S125. For example, if it is known that subjects presented stimuli in a noisy room typically have lower engagement levels than subjects presented stimuli in a quiet room, neural data from subjects may be transformed based on the noise level of the room, as captured by S125. As another example, eye tracking data may be used to remove artifacts associated with eye movement from EEG data.

Capturing neural data S120 may additionally or alternatively include checking captured neural data for neural abnormalities. For example, after neural data is captured, it may be examined (either manually or automatically) to detect abnormalities or issues in the brains of subjects. If abnormalities are detected, the captured neural data in which abnormalities are detected may be flagged or deleted to prevent said neural data from being used in neural similarity calculations. Neural abnormalities may include any effects that result in non-neurotypical brain response.

Capturing additional data S125 functions to capture data additional to the neural data captured by S120. Additional data may include subject response data, subject descriptive data, environmental data, and/or other data. Subject response data preferably includes data on how subjects respond to the stimuli presented by S110. Subject response data may include measured responses, such as biometric data (e.g., heart rate or perspiration), eye tracking data, and facial recognition data. Additional examples of biometric data include pupil dilation, blood pressure, body temperature, typing rhythm, gait, posture, and speech characteristics.

Subject response data may also include reported responses, such as self-reported engagement ratings from subjects or tests of subject recall of presented information. Subject descriptive data preferably includes demographic data on the subjects; for example, their age, race and gender. Subject descriptive data may also include more specific data relating to a person, such as a list of their recent purchases or their tastes in movies. Subject descriptive data may be collected manually (e.g., by asking a subject) or automatically as part of the method 100 (e.g., by downloading information about a subject from a social media platform).

Environmental data preferably includes data pertaining to the environment stimuli are presented in; for example, temperature, time of presentation, light level, and level of background noise in the environment.

Calculating neural similarity S130 functions to calculate similarity levels between sets of neural data corresponding to different individual subjects.

Sets of neural data are preferably aligned before calculating neural similarity. Neural datasets are preferably aligned by relying on correspondences given by anatomical registration to a standardized space, but may additionally or alternatively be aligned using any suitable technique (e.g., methods that rely on alignment of both anatomical structure and functional landmarks).

Sets of neural data may additionally or alternatively be processed before calculating neural similarity; for instance, neural data from certain regions of the brain may be weighted more heavily than other regions of the brain.

Calculating neural similarity preferably includes calculating cross-brain correlations on each possible pairing of subjects. For example, if there are three subjects A, B, and C, cross-brain correlations would be calculated for the A,B pair, the A,C pair, and the B,C pair. Calculating neural similarity may additionally or alternatively include calculating cross-brain correlations between only a subset of possible pairings, and/or calculating neural similarity using another method (e.g., by Inter-Subject Correlation). Calculating neural similarity preferably includes calculating neural similarity at each fMRI or EEG timestep, but alternatively may include calculating neural similarity according to any other suitable timing. Calculating neural similarity preferably includes calculating neural similarity across entire neural datasets corresponding to each person (i.e. all of the spatial data captured at each time step) but may alternatively include calculating neural similarity over only a spatial and/or temporal subset of neural datasets. For example, a set of neural data may be not used for neural similarity calculations if the corresponding subject moved too much during data collection, or if the collected data is obviously corrupted, or if the subject failed to comprehend the stimuli presented.

Sets of neural data to be removed from neural similarity calculations may be detected by identifying the data sets to be removed as statistical outliers (e.g., data sets with multiple data points more than three standard deviations from mean values), but may additionally or alternatively be detected in any suitable way (e.g., particular markers of abnormal response).

Figure 4:
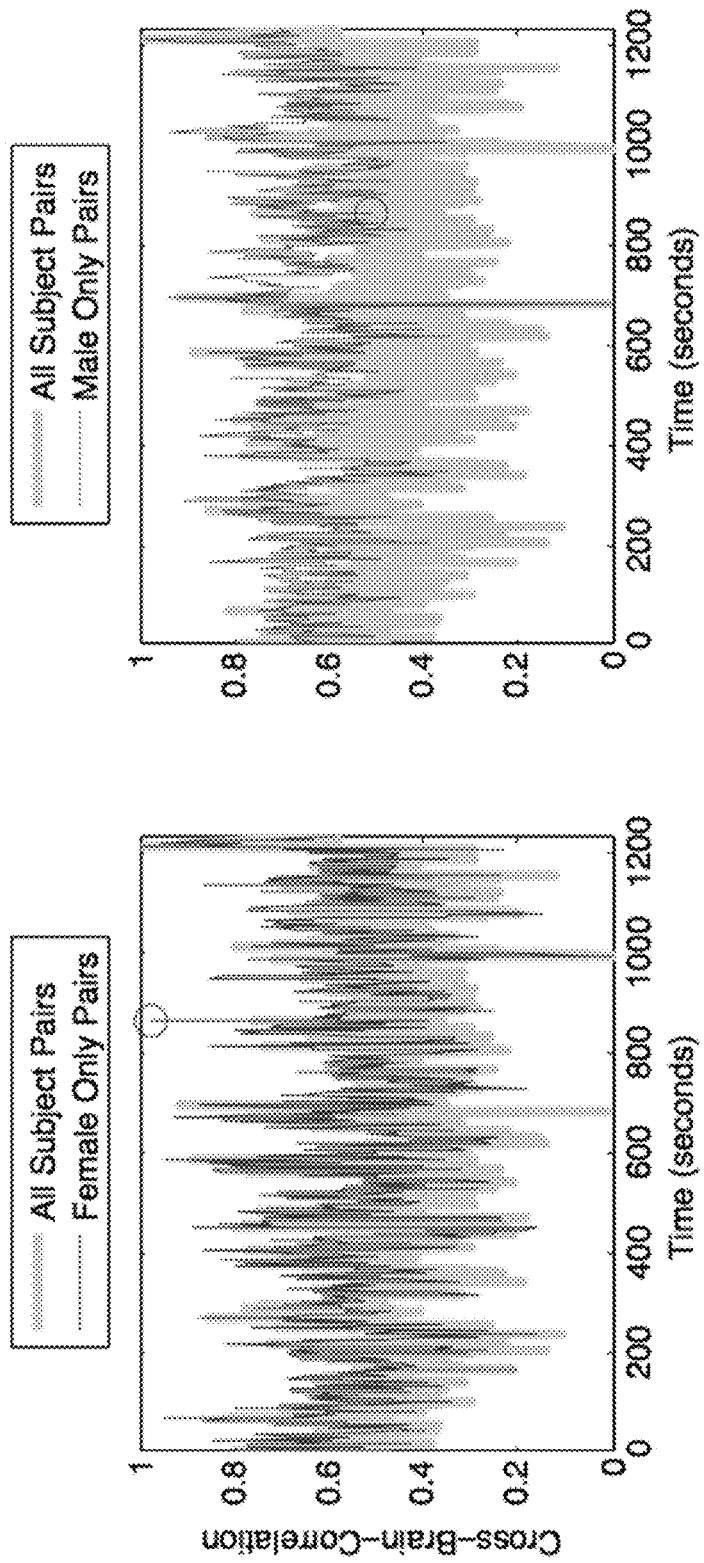
FIG. 4 is a plot view of engagement measures of a method of a preferred embodiment.

Generating a measure of engagement S140 functions to generate a measure of engagement based on neural similarity calculations. Generating a measure of engagement preferably includes generating an averaged measure of engagement; for example, generating a measure of engagement averaged across all subjects presented with particular stimuli. Averaged measurements of engagement are preferably generated by taking mean values, but may additionally or alternatively be generated by taking any other linear combination of values, or any other measure of central tendency (e.g., median values). As shown in FIG. 4, generating an averaged measure of engagement may additionally or alternatively include generating averaged measures of engagement across subsets of all subjects presented with particular stimuli. For example, averaged measures of engagement might be generated for different demographic subsets of the set of all subjects. This might include generating measures of engagement from neural similarity between subjects of each demographic exclusively, or it might include generating measures of engagement from neural similarities between all subjects and then splitting these measures of engagement into their respective demographics. As another example, averaged measures of engagement might be calculated from a subset of all subjects that excludes outliers. Outliers are preferably automatically detected by S140; if a set of neural data associated with a particular subject fails to reach a correlation threshold during time periods where the majority of sets of neural data exhibit high correlation, that set of neural data is preferably labeled an outlier and excluded from averaged measures of engagement. Alternatively, outliers may be detected by another automatic method, or may be detected manually.

In an alternative embodiment, the method 100 may be intentionally used to detect outliers for purposes of brain research or diagnosis. For example, the method 100 may be used to detect or predict autism spectrum disorders by identifying outliers. If the method 100 is used for this purpose, the detection of outliers is preferably more complex than simply identifying neural data sets that differ from the mean. The detection of outliers preferably includes producing additional outlier data. For example, outliers may be compared to a model of predicted response for a particular disorder, or to past data of subjects diagnosed with a particular disorder, or by any other appropriate means. Detection and/or identification of outliers may occur automatically, but alternatively may occur only when manually requested. Identifying outliers preferably occurs according to at least one outlier identifying function. The outlier identifying functions are preferably static, but alternatively may include machine learning algorithms or other types of dynamic algorithms, that produce results based on past results, that produce results based on external data or models, and/or can adapt to presented data.

Generating an averaged measure of engagement may additionally or alternatively include generating a weighted averaged measure of engagement. For example, if a particular demographic is more important (e.g., is the target market for stimuli) and/or responds differently (in terms of neural similarity) to presented stimuli, neural data from that demographic might be weighted more or less strongly in the calculation of the weighted averaged measure of engagement.

Generating an averaged measure of engagement may additionally or alternatively include generating a piecewise averaged measure of engagement. A piecewise averaged measure of engagement is preferably formed by only considering neural similarity measurements that compare a subject in one subset of all subjects to other subjects in the same subset. For example, a piecewise averaged measure of engagement may be formed by forming averaged measures of engagement for three age groups; the averaged measure for each age group is generated only from neural similarities between members of that age group. Then, the three averaged measures of engagement are combined (and possibly weighted) to determine the piecewise averaged measure of engagement.

Figure 3:
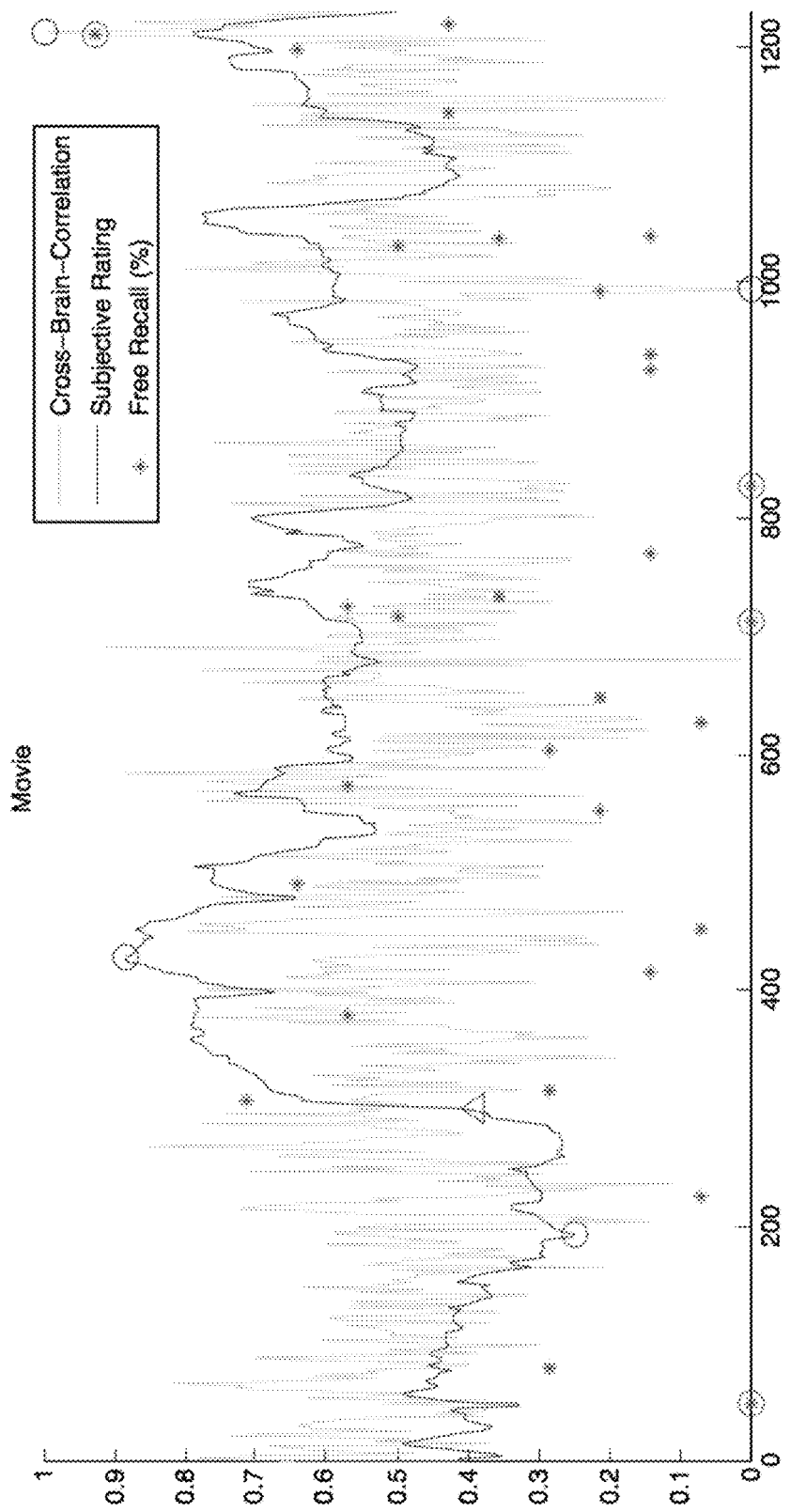
FIG. 3 is a plot view of engagement measures of a method of a preferred embodiment.

In a first embodiment, the measure of engagement is a plot of at least one averaged measure of engagement, where the averaged measures of engagement are plots of mean neural similarity vs. time, as shown in FIG. 3. Neural similarity is preferably represented by cross-brain correlation coefficients.

In a second embodiment, the measure of engagement is a plot of at least one averaged measure of engagement, where the averaged measures of engagement are plots of an engagement function vs. time. The engagement function is preferably calculated from neural data and additional data, but alternatively may be calculated from solely neural data or solely additional data. The engagement function preferably calculates engagement from measurements of neural similarity and additional data that corresponds to engagement. The engagement function may additionally or alternatively accept additional data as weighting and/or transforming variables; for example, data corresponding to room temperature at the time of stimuli presentation might weight or otherwise modify the outcome of the engagement function.

The engagement function is preferably a static function, but may additionally or alternatively include a machine learning algorithm or other dynamic function that produces results based on past results, that produces results based on external data or models, and/or can adapt to presented data. If the engagement function can learn, it preferably is trained with additional forms of engagement data. For example, the engagement function may be trained by self-reported measures of engagement or by other known engagement metrics.

In a variation of the second embodiment, the measure of engagement for a group of subjects may be calculated by correlating additional data to neural data. For example, a first measure of engagement is calculated based on fMRI data taken from a first set of subjects; eye tracking data is captured simultaneously with fMRI data, but is not necessarily used in the calculation of the first measure of engagement. A second measure of engagement is desired to be calculated from a second set of subjects, but fMRI data is not available; therefore, only eye tracking data is captured. A mapping between the neural data and eye tracking data of the first subjects can be used to create a function that provides predicted neural data (or predicted cross-brain correlation data) for the second set of subjects based on their eye tracking data, potentially increasing the accuracy of the second measure of engagement (over a second measurement of engagement based solely on the eye tracking data of the second set of subjects).

In a third embodiment, the measure of engagement is an engagement score. The engagement score is preferably calculated from averaged measurements of engagement as a function of time; the averaged measurements of engagement are preferably aggregated or averaged over time to produce the engagement score. The averaged measures of engagement may be weighted either as described previously or as a function of time (i.e. data from some time periods may be weighted more heavily than data from other time periods).

Generating a measure of engagement S140 may additionally or alternatively include generating or predicting other metrics in a manner substantially similar to generating the measure of engagement. For example, neural similarities may be used to predict free recall of the stimuli presented to subjects. Generated measures of engagement may also be used for the same purpose. Other metrics that may be generated or predicted could relate to attention, memory, motivation, or any other suitable metric. For example, Step S140 may include generating predicted box office sales and/or sales demographics for a movie (based on measures of engagement).

Predicting a measure of engagement S145 functions to predict how engaged a particular subject or group of subjects will be by particular stimuli. The predicted measure of engagement is preferably in the form of a measure of engagement as described in S140, but alternatively may be in any suitable form. Predicted measures of engagement are preferably generated by a prediction function. The prediction function preferably makes predictions of engagement for stimuli based on past calculated measures of engagement for the stimuli, but may additionally or alternatively use any other suitable data (for example, audience self-reported engagement ratings) related to the stimuli.

The prediction function preferably predicts engagement by receiving data about the subject or group of subjects. The data preferably includes neural data and/or additional data, but additionally or alternatively may include any suitable data describing the prediction subject or group of subjects. This data is then preferably compared to data corresponding to previous subjects for whom measures of engagement were calculated for particular stimuli. Based on these comparisons, similarity scores are calculated. Data from previous subjects who exhibit a similarity score above some similarity threshold is then preferably used to calculate a measure of engagement for the stimuli in substantially the same manner as in S140. Additionally or alternatively, previously calculated measures of engagement may be used to calculate the measure of engagement. This measure of engagement is preferably then used as the predicted measure of engagement for the subject or group of subjects. Additionally or alternatively, the measure of engagement may be a basis for further calculations to create the predicted measure of engagement. For example, the measure of engagement may correspond to data taken in an fMRI lab; this measure of engagement may need to be weighted or modified to correspond to predicted engagement in a movie theater.

Additionally or alternatively, data from previous subjects may be weighted by the similarity scores. For example, data from subjects more similar to the prediction subjects may be weighted more heavily than data from subjects less similar to the prediction subjects.

In an alternative embodiment, the prediction function may make predictions about stimuli for which there is no past neural data or measures of engagement. In this embodiment, the prediction function preferably compares stimuli to stimuli for which engagement has previously been measured (reference stimuli). This comparison is preferably a comparison of characteristics of the stimuli. The characteristics may be inherent to the stimuli (for example, the audio waveform of an audio track) or not inherent to the stimuli (for example, a list of times the main character of a movie appears on the screen). The characteristics may also be predicted characteristics; for example, a list of times in a movie that the producers have predicted to contain engaging content. Based on this comparison, the stimuli considered most similar to the stimuli is preferably used for predictive purposes in substantially the same manner described in the preceding paragraphs. Additionally or alternatively, a combination of data for multiple stimuli may be used for predictive purposes. This combination of data is preferably weighted by the extent to which the reference stimuli resemble the stimuli for which prediction is desired. Additionally or alternatively, this combination of data may be transformed or modified based on differences between the reference stimuli and the stimuli for which prediction is desired. For example, if the reference stimuli are shorter than the stimuli for which prediction is desired, the data corresponding to the reference stimuli may be stretched and/or interpolated to match the timescale of the data corresponding to the stimuli for which prediction is desired.

The methods of the preferred embodiment and variations thereof can be embodied and/or implemented at least in part as a machine configured to receive a computer-readable medium storing computer-readable instructions. The instructions are preferably executed by computer-executable components preferably integrated with a computer system. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

As a person skilled in the art will recognize from the previous detailed description and from the figures and claims, modifications and changes can be made to the preferred embodiments of the invention without departing from the scope of this invention defined in the following claims.

We claim:

1. A method for measuring engagement comprising:
   presenting a first set of stimuli to a first subset of a first set of subjects in a first environment;
   capturing neural data from the first set of subjects;
   capturing environmental data from the first environment; wherein environmental data comprises at least one of ambient temperature data and ambient lighting data;
   presenting the first set of stimuli to a second subset of the first set of subjects in a second environment;
   capturing environmental data from the second environment; wherein environmental data comprises at least one of ambient temperature data and ambient lighting data;
   calculating a first set of neural similarities between each possible pairing of subjects of the first set of subjects; and
   generating a first measure of engagement from the first set of neural similarities; wherein generating the first measure of engagement comprises weighting neural similarities of the first set of neural similarities according to captured environmental data.

2. The method of claim 1, further comprising analyzing the neural data to identify neural abnormalities; further comprising using neural abnormalities to aid in neural disorder diagnosis.

3. The method of claim 1, wherein the first environment and the second environment are different environments.

4. The method of claim 1, wherein capturing environmental data from the second environment comprises capturing environmental data in a same location as the first environment, but at a different time.

5. The method of claim 1, wherein capturing neural data comprises:
   capturing EEG data at a plurality of electrode channels for a set of timesteps;
   performing a Short-time Fourier Transform upon the EEG data at each timestep of the set of timesteps, for each electrode channel of the plurality of electrode channels, to generate a Power Spectral Density matrix;
   filtering the Power Spectral Density matrixes; and
   averaging the Power Spectral Density matrixes across the plurality of electrode channels.

6. The method of claim 5, further comprising generating a predicted measure of engagement for a second set of stimuli.

7. The method of claim 1, further comprising generating a predicted measure of engagement for a second set of stimuli.

8. The method of claim 1, further comprising using the first measure of engagement and the captured environmental data to determine how the captured environmental data modifies the outcome of the first measure of engagement.

9. A method for measuring engagement comprising:
   presenting a first set of stimuli to a first set of subjects in a first environment;
   capturing neural data from the first set of subjects wherein capturing neural data comprises:
      capturing EEG data at a plurality of electrode channels for a set of timesteps;
      performing a Short-time Fourier Transform upon the EEG data at each timestep of the set of timesteps, for each electrode channel of the plurality of electrode channels, to generate a Power Spectral Density matrix;
      filtering the Power Spectral Density matrixes; and
      averaging the Power Spectral Density matrixes across the plurality of electrode channels;
   calculating a first set of neural similarities between each possible pairing of subjects of the first set of subjects; and
   generating a first measure of engagement from the first set of neural similarities.

10. The method of claim 9, further comprising predicting a second measure of engagement for the first set of stimuli, as presented in a second environment, by modifying the first measure of engagement based on differences in environmental characteristics between the first environment and the second environment.

11. The method of claim 9, further comprising predicting a second measure of engagement for a second set of stimuli by producing a comparison of the first set of stimuli and the second set of stimuli, and modifying the first measure of engagement based on the comparison of the first set of stimuli and the second set of stimuli.

12. The method of claim 9, further comprising identifying a first set of outlier subjects from the first set of subjects based on the first set of neural similarities.

13. The method of claim 12, further comprising comparing neural data of the first set of outlier subjects to a predicted response for a neural disorder and calculating a disorder probability for each of the first set of outlier subjects; wherein the disorder probability is a probability that an outlier subject has the neural disorder.

14. The method of claim 13, wherein the predicted response is generated from previously collected neural similarity data.

* * * * *